US008368207B2

(12) United States Patent
Steger et al.

(10) Patent No.: US 8,368,207 B2
(45) Date of Patent: Feb. 5, 2013

(54) PRESSURE-CONTACT POWER SEMICONDUCTOR MODULE AND METHOD FOR PRODUCING THE SAME

(75) Inventors: Jürgen Steger, Hiltpoltstein (DE); Frank Ebersberger, Altdorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 12/080,624

(22) Filed: Apr. 4, 2008

(65) Prior Publication Data
US 2008/0266812 A1 Oct. 30, 2008

(30) Foreign Application Priority Data

Apr. 4, 2007 (DE) .................. 10 2007 016 222

(51) Int. Cl.
  H01L 23/52 (2006.01)
  H01L 23/12 (2006.01)
  H01L 23/10 (2006.01)
  H01L 23/34 (2006.01)
(52) U.S. Cl. ........ 257/718; 257/691; 257/704; 257/706; 257/726; 257/E23.078; 257/E21.515
(58) Field of Classification Search .................. 257/678, 257/704, 706, 718, 691, 697, 726, E23.078, 257/E21.515
See application file for complete search history.

(56) References Cited

U.S. PATENT DOCUMENTS

| 3,808,471 | A | * | 4/1974 | Grandia | 257/717 |
|---|---|---|---|---|---|
| 4,414,562 | A | * | 11/1983 | Kiley et al. | 257/719 |
| 4,679,118 | A | * | 7/1987 | Johnson et al. | 361/718 |
| 4,748,495 | A | * | 5/1988 | Kucharek | 257/713 |
| 5,204,805 | A | * | 4/1993 | Takahashi et al. | 361/720 |
| 5,397,245 | A | * | 3/1995 | Roebuck et al. | 439/264 |
| 5,468,157 | A | * | 11/1995 | Roebuck et al. | 439/264 |
| 5,468,158 | A | * | 11/1995 | Roebuck et al. | 439/264 |
| 5,571,027 | A | * | 11/1996 | Roebuck et al. | 439/264 |
| 5,625,944 | A | * | 5/1997 | Werther | 29/843 |
| 6,061,235 | A | * | 5/2000 | Cromwell et al. | 361/690 |
| 6,381,836 | B1 | * | 5/2002 | Lauruhn et al. | 29/831 |
| 6,401,807 | B1 | * | 6/2002 | Wyler et al. | 165/121 |
| 6,703,640 | B1 | * | 3/2004 | Hembree et al. | 257/48 |
| 6,791,838 | B1 | * | 9/2004 | Hung et al. | 361/704 |
| 6,803,650 | B2 | * | 10/2004 | Crane, Jr. et al. | 257/697 |
| 6,885,557 | B2 | * | 4/2005 | Unrein | 361/704 |
| 7,190,070 | B2 | | 3/2007 | Manz et al. | |

(Continued)

FOREIGN PATENT DOCUMENTS

| DE | 101 49 886 | 4/2003 |
|---|---|---|
| DE | 103 16 356 | 11/2004 |

*Primary Examiner* — Teresa M Arroyo
(74) *Attorney, Agent, or Firm* — The Law Offices of Roger S. Thompson

(57) ABSTRACT

A pressure-contact power semiconductor module is arranged on a heat sink. The power semiconductor module is used with at least one substrate provided with conductor tracks and power semiconductor components. The module has a mounting body, on the underside of which the at least one substrate is arranged, and which is formed with cutouts. The module also includes a load connection element which is provided with contact feet that project away from strip sections and make pressure contact with the conductor tracks. The power semiconductor module additionally has a dimensionally stable cover, which covers the mounting body on all sides and is connected to the mounting body by means of snap-action latching connections. At least one pad element is restrained between the cover and the strip sections of the load connection elements.

10 Claims, 2 Drawing Sheets

U.S. PATENT DOCUMENTS

| | | | |
|---|---|---|---|
| 2002/0104751 A1* | 8/2002 | Drewery et al. | 204/192.1 |
| 2003/0057548 A1* | 3/2003 | Hartke et al. | 257/718 |
| 2004/0092147 A1* | 5/2004 | De Petris | 439/246 |
| 2004/0203528 A1* | 10/2004 | Ammar et al. | 455/90.3 |
| 2004/0217465 A1 | 11/2004 | Stolze | |
| 2005/0047096 A1* | 3/2005 | Wakabayashi et al. | 361/719 |
| 2008/0158823 A1* | 7/2008 | Tominaga et al. | 361/709 |
| 2009/0146055 A1* | 6/2009 | Sauk et al. | 250/310 |

* cited by examiner

PRESSURE-CONTACT POWER SEMICONDUCTOR MODULE AND METHOD FOR PRODUCING THE SAME

BACKGROUND OF THE INVENTION

1. Field of the Invention

This invention is directed to the field of power semiconductor modules and, more particularly, to pressure-contact semiconductor modules and a method for producing them.

2. Description of the Related Art

Power semiconductor modules of this general type are known in various embodiments. By way of example, German Patent Application No. DE 103 16 356 A1 describes a power semiconductor module of this type which comprises a number of partial modules each having a base plate and also a frame-like housing and connection elements for load and auxiliary connections. The individual partial modules are assembled to form a whole power semiconductor module by means of a common cover and/or by means of connections that fix the individual partial modules in place.

A power semiconductor module comprising at least one substrate on which power semiconductor components are situated is for example also known from German Patent Application No. DE 101 49 886 A1. This known power semiconductor module additionally comprises a press-on device which acts on the at least one substrate and which serves to press the/each substrate in the mounted state onto a heat sink in order to dissipate the heat loss of the power semiconductor components through the heat sink. In this known power semiconductor module, the press-on device is formed by a module housing having at least one spring-elastic region.

SUMMARY OF THE INVENTION

It is an object of the invention to provide a pressure-conductor power semiconductor module, for arrangement on a cooling component such as a heat sink, which can be produced cost-effectively and simply, and to provide a method for producing such a power semiconductor module.

In this case, it has proved to be advantageous if the module includes a mounting body having an associated peripheral frame web at its underside for the precise positioning of at least one substrate thereunder. The/each peripheral frame web has internal dimensions that match the external edge dimensions of the associated substrate.

It is advantageous if the mounting basic body has, on its underside, cutouts for shaft elevations that receive contact feet. The shaft elevations advantageously form guides for the contact feet, which guides optimize the positioning of the contact feet in relation to the conductor tracks of the at least one substrate.

According to the invention, the mounting body is preferably formed on its top side with a peripheral frame edge, from which resilient latching fingers project, and the cover is preferably formed with latching holes to mate with the latching fingers. The latching fingers of the mounting body and the latching holes of the cover together form snap-action latching connections between the mounting body and the cover.

In the power semiconductor module according to the invention, it has proved to be advantageous if the top side of the mounting body is formed with pedestals for the load connection elements, and the cover is formed with shafts matched to the pedestals. Such an embodiment affords the advantage that the cover can be arranged simply, quickly and precisely on the mounting body equipped with load connection elements—and with auxiliary connection elements. Before the cover is connected to the mounting body, however, at least one pad element is arranged on the strip sections of the load connection elements.

Preferably, threaded sleeves are integrated into the pedestals of the mounting body, the threaded sleeves being axially aligned with through holes formed in connection contacts of the load connection elements. The connection contacts are externally accessible through the shafts which are formed in the cover and are matched to the pedestals, such that in the assembled state of the power semiconductor module according to the invention—after the module has been fixed to a heat sink—it is possible to connect, i.e. fixedly screw—connection cables or the like to the connection contacts.

The cover can have an additional fixing shaft with a fixing hole for fixing the power semiconductor module to the heat sink.

The cover of the power semiconductor module according to the invention is advantageously a cover which is injection-molded from a suitable plastic material and which is preferably formed with stiffening ribs in order to obtain the desired stiffness and dimensional stability on its top side. In this case, the stiffening ribs are preferably configured in such a way that the cover is formed with receiving compartments for capacitors on its top side.

In the power semiconductor module according to the invention, it is preferred if the at least one substrate is pressure-contact-connected, by means of resilient auxiliary connection elements positioned on the mounting body to a circuit board which is fitted to the cover and from which auxiliary contacts project away. In this case, it is preferred if the cover is formed with auxiliary shafts for the auxiliary contacts. In such an embodiment, it is likewise preferred if the mounting body is formed with auxiliary pedestals for the auxiliary shafts into which threaded sleeves are integrated which sleeves are axially aligned with holes formed in the auxiliary connection elements.

The object of the invention is achieved according to the method by virtue of the fact that firstly the load connection elements are arranged on the mounting body and insulated from one another, wherein the contact feet of the load connection elements are disposed through the cutouts formed in the mounting body such that the contact feet project below the underside of the mounting body. Afterwards, the at least one pad element is arranged on the strip sections of the load connection elements. Resilient auxiliary connection elements are positioned on the mounting body. The cover is fitted to the mounting body and connected to the mounting body by means of the snap-action latching connections, and, finally, the at least one substrate is coated with an insulating layer and then fixed to the underside of the mounting body by means of the insulating layer. The insulating layer is a silicone gel, for example, which is applied to the at least one substrate by means of any known coating method. This results in effective internal insulation of the power semiconductor module.

The power semiconductor module assembled in this way can then be fixed on an associated heat sink. This fixing brings about the pressure-contact-connection of the load and auxiliary connections to the at least one substrate.

Further details, features and advantages will become apparent from the following description of an exemplary embodiment of the power semiconductor module according to the invention that is illustrated in the drawing.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
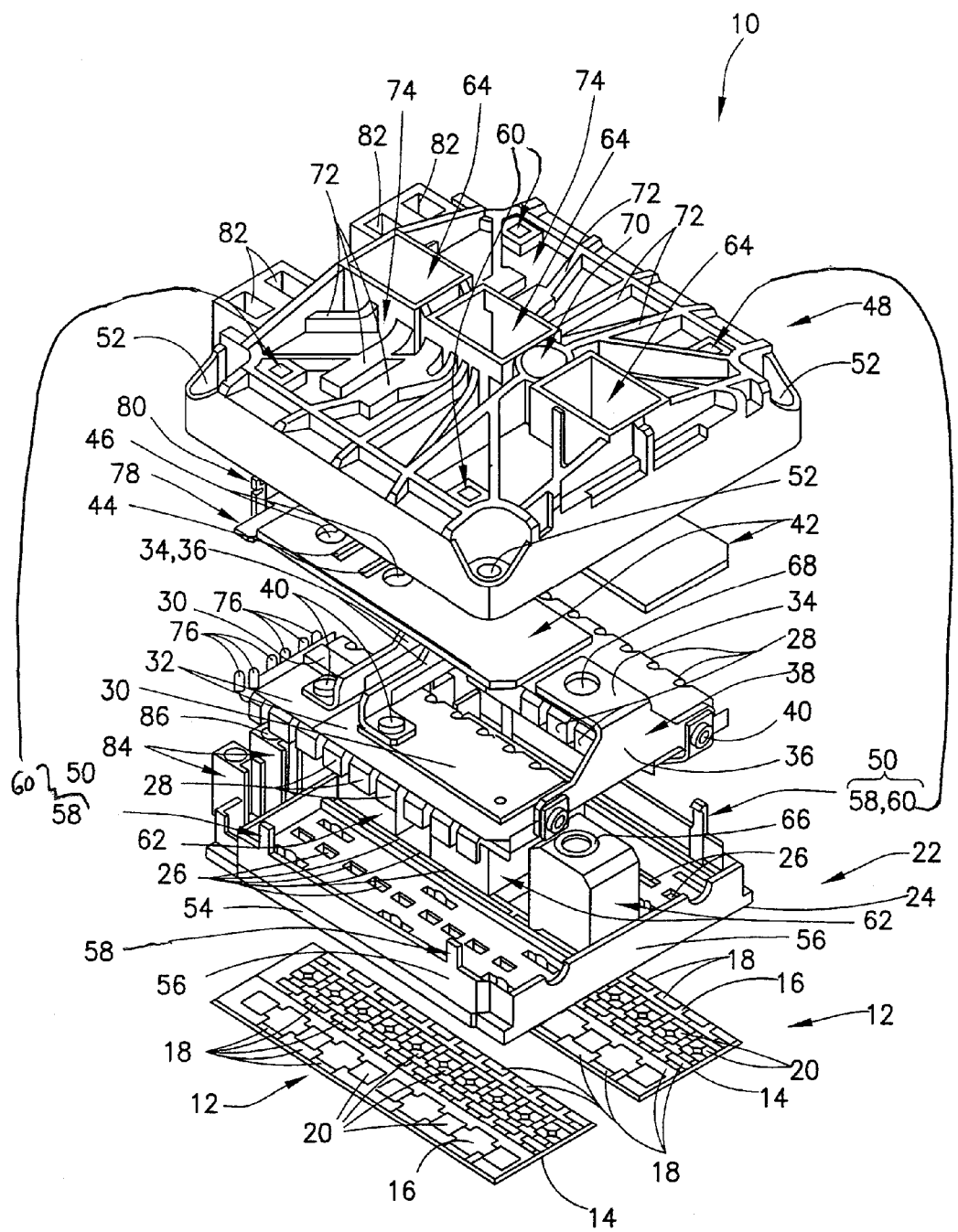
FIG. 1 shows a three-dimensional exploded illustration of an embodiment of a pressure-contact power semiconductor module 10 in accordance with the invention.
Figure 2:
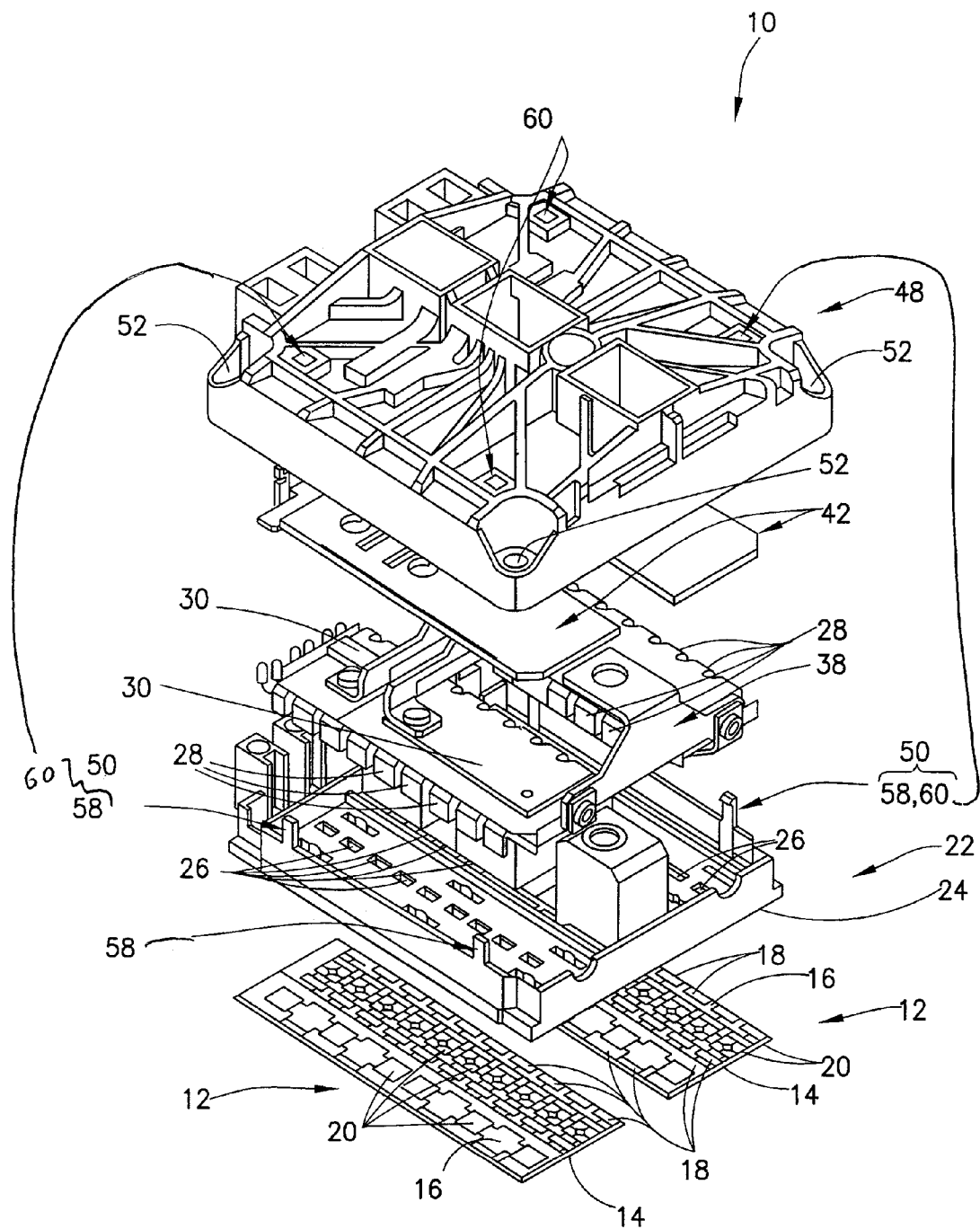
FIG. 2 is a blow-up of FIG. 1 with certain reference numerals omitted for clarity.

A power semiconductor module in accordance with the invention is shown, generally at 10, in the FIGURE. Module 10 includes several individual elements, arranged one atop the other, all on top of one or more substrates 12 (two are illustrated, but the number and orientation of substrates 12 is a matter of design choice). Substrates 12 each have a bottom side 14 and a top side 16. Bottom side 14 has a large metallized area to allow for dissipation of heat through contact with a heat sink or other cooling component (not shown) positioned therebeneath. Components 20 are electrically connected with conductor tracks 18, for example by bonding wires (not shown) or other conventional means as is known.

Placed above substrate 12 is a mounting body 22 which has an underside 24 that overlies substrate 12 and is bounded by self-contained peripheral frame webs 54. Peripheral frame webs 54 are dimensioned so that the interior of the frame webs 54 substantially matches the exterior edge of substrate 12, so that substrate 12 may be seated within the peripheral frame webs 54. Mounting body 22 further includes a plurality of cutouts 26 disposed therethrough and is surrounded by a peripheral frame edge 56 disposed atop peripheral frame webs 54. A plurality of latching fingers 58 project upwardly from peripheral frame web 54. A plurality of pedestals 62 also project upwardly from mounting body 22, and have threaded sleeves 66 integrated therein. Substrate 12 may be attached to underside 24 of mounting body 22 by any suitable means, such as by applying an adhering insulating layer, e.g. a silicon gel (not separately numbered), on top of substrate 12 and then contacting underside 24 of mounting body 22 with the insulating layer to adhere the two together. This provides insulation between the two in addition to fixing them together.

A load connection element 38 is disposed above mounting body 22. Load connection element 38 is formed of contact feet 28 and strip sections 30 held together by connecting sections 36 (only one of which is visible in the FIGURE). Strip sections 30 are separated by insulating layers 32. Contact feet 28 project away from strip sections 30, and are configured to extend through cutouts 26 of mounting body 22 to make pressure contact (when module 10 is assembled) with conductor tracks 18 of substrate 12. Load connection elements 38 further include respective connection contacts 34 each having a through hole 68 formed therein. Through holes 68 are aligned with threaded sleeves 66 in pedestals 62 of mounting body 22.

Each connecting section 36 is fixedly connected to an associated strip section 30 in any desired manner, such as, for example, by rivets 40.

Next, elastic pad elements 42 are arranged on strip sections 30 of load connection elements 38. Pad elements 42 are formed with cutouts 44 corresponding to connecting sections 36 and holes 46 corresponding to rivets 40.

A cover 48 covers mounting body 22, load connection element 38 and elastic pads 42, on all sides. Cover 48 includes fixing holes 52 for fixing, e.g. by screws (not shown), cover 48 to the heat sink, and latching holes 60 for mating with latching fingers 58 of mounting body 22 to form snap-action latching connections 50 for connecting cover 48 to mounting body 22.

Cover 48 further includes shafts 64 aligned with threaded sleeves 66 of pedestals 62. Cover 48 may therefore be fixed in place by means of suitable conventional connectors (not shown) that extend through shafts 64 and through holes 68 to mate with threaded sleeves 66.

Cover 48 also includes a fixing shaft 70 having a fixing hole (not visible in the FIGURE) formed between shafts 64, i.e. between the right-hand and the middle shaft 64 in the FIGURE. An additional fixing of the power semiconductor module 10 to the heat sink is thereby possible.

For this reason, cover 48 is formed with stiffening ribs 72 on its top side. Stiffening ribs 72 are preferably configured in such a way that cover 48 has receiving compartments 74 for capacitors (not illustrated) on its top side.

Substrates 12 are pressure-contact-connected, by means of resilient auxiliary connection elements 76 positioned on mounting body 22, to a circuit board 78 which is fixed to cover 48 on the inside and from which auxiliary contacts 80 project. Cover 48 is formed with auxiliary shafts 82 provided for auxiliary contacts 80. Mounting body 22 is formed with auxiliary pedestals 84 which are matched to auxiliary shafts 82 and into which are integrated threaded sleeves 86 which are axially aligned with holes—not visible in the FIGURE—in auxiliary contacts 80 in the assembled state of power semiconductor module 10.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A pressure-contact power semiconductor module, for positioning on a heat sink and for use with a substrate, the substrate having a bottom side for disposing in thermal contact with the heat sink and having a top side opposite to the bottom side with conductor tracks and power semiconductor components connected to the conductor tracks, wherein the module comprises:

a mounting body positioned overlying the substrate and having cutouts disposed therethrough;

a load connection element positioned on said mounting body, said load connection element having strip sections insulated from one another and positioned on at least one side of the load connection element, and contact feet that extend away from said strip sections and through said cutouts to provide electrical contact with the conductor tracks of the substrate;

a dimensionally stable stiff cover which covers said mounting body on all sides and is connected to said mounting body by means of a snap-action latching connection for fixing the cover to the heat sink, wherein the snap-action latching connection includes latching holes in the cover for mating with upwardly projecting resilient latching fingers formed at corners of the mounting body; and an elastic pad element disposed between said cover and said strip sections of said load connection element.

2. The power semiconductor module of claim 1, wherein said cover includes fixing holes disposed therethrough for fixing the cover to the heat sink.

3. The power semiconductor module of claim 1, wherein said mounting body has a peripheral frame web on its underside for the positioning of the substrate therebeneath.

4. The power semiconductor module of claim 1, wherein said mounting body includes pedestals formed on a top side thereof and said cover includes shafts for attaching to said pedestals and for aligning said cover with said mounting body and affixing said cover to said mounting body.

5. The power semiconductor module of claim 4, wherein said pedestals include threaded sleeves integrated therein and said load connection element includes connection contacts thereon having through holes formed therein, said through holes being axially aligned with said threaded sleeves for aligning said mounting body and said load connection element.

6. The power semiconductor module of claim 1, wherein said cover includes a fixing shaft having a fixing hole for additionally fixing the cover to the heat sink.

7. The power semiconductor module of claim 1, wherein a circuit board is fitted between said cover and the load connection element and includes auxiliary contacts projecting upwardly therefrom; and wherein said load connection element includes resilient auxiliary connection elements at a periphery thereof; whereby the substrate is electrically connected to the circuit board by means of pressure contact between said resilient auxiliary connection elements and the auxiliary contacts.

8. The power semiconductor module of claim 7, wherein said cover includes auxiliary shafts to provide access to the auxiliary contacts.

9. The power semiconductor module of claim 7, wherein said resilient auxiliary connection elements have through holes formed therein; and wherein said mounting body includes auxiliary pedestals into which threaded sleeves are integrated; whereby said threaded sleeves are positioned to be axially aligned with said through holes to position said mounting body in place.

10. A method for producing a pressure-contact power semiconductor module for use with a substrate, the substrate having a top side with conductor tracks and power semiconductor components disposed thereon, the module comprising:

a mounting body positioned overlying the substrate and having cutouts disposed therethrough;

a load connection element positioned on said mounting body, said load connection element having strip sections insulated from one another and positioned on at least one side of the load connection element, and contact feet that extend away from said strip sections and through said cutouts to provide electrical contact with the conductor tracks of the substrate;

a dimensionally stable stiff cover which covers said mounting body on all sides and is connected to said mounting body by means of a snap-action latching connection for fixing the cover to a cooling component, wherein the snap-action latching connection includes latching holes in the cover for mating with upwardly projecting resilient latching fingers formed at corners of the mounting body; and an elastic pad element disposed between said cover and said strip sections of said load connection element;

wherein the method comprises the steps of:

arranging said load connection element on said mounting body, wherein said contact feet of said load connection element are disposed through said cutouts in said mounting body such that said contact feet project from said mounting body on the underside thereof and through said cutouts to provide electrical contact with the conductor tracks of the substrate;

arranging said pad element on the strip sections of said load connection element;

positioning resilient auxiliary connection elements on said mounting body;

fitting said cover to said mounting body;

connecting said cover to said mounting body by closing said snap-action latching connections; and fixing the substrate coated with the insulating layer to the underside of said mounting body.

* * * * *